(12) United States Patent
Ren et al.

(10) Patent No.: US 11,991,914 B2
(45) Date of Patent: May 21, 2024

(54) TRANSPARENT DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yanping Ren, Beijing (CN); Yudan Shui, Beijing (CN); Wenkang Wang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 674 days.

(21) Appl. No.: 17/267,477

(22) PCT Filed: May 9, 2020

(86) PCT No.: PCT/CN2020/089495
§ 371 (c)(1),
(2) Date: Feb. 9, 2021

(87) PCT Pub. No.: WO2020/253418
PCT Pub. Date: Dec. 24, 2020

(65) Prior Publication Data
US 2021/0296410 A1    Sep. 23, 2021

(30) Foreign Application Priority Data
Jun. 18, 2019 (CN) .......................... 201910528692.X

(51) Int. Cl.
| | | |
|---|---|---|
| *H10K 59/50* | (2023.01) | |
| *B60J 3/04* | (2006.01) | |
| *B60R 11/00* | (2006.01) | |
| *B60R 11/02* | (2006.01) | |
| *G02F 1/01* | (2006.01) | |
| *G02F 1/155* | (2006.01) | |
| *G02F 1/157* | (2006.01) | |
| *H10K 59/12* | (2023.01) | |

(52) U.S. Cl.
CPC ................ *H10K 59/50* (2023.02); *B60J 3/04* (2013.01); *B60R 11/0235* (2013.01);
(Continued)

(58) Field of Classification Search
None
See application file for complete search history.

(56) References Cited

U.S. PATENT DOCUMENTS

2016/0104752 A1    4/2016   Oh et al.
2016/0172633 A1    6/2016   Ahn et al.
(Continued)

FOREIGN PATENT DOCUMENTS

CN    104362169 A    2/2015
CN    105702704 A    6/2016
(Continued)

OTHER PUBLICATIONS

Hu et al., Display Panel and Display Device, CN 109585521A, Apr. 5, 2019. (Year: 2019).*
(Continued)

*Primary Examiner* — Alexander G Ghyka
(74) *Attorney, Agent, or Firm* — IPro, PLLC

(57) ABSTRACT

Disclosed in the present disclosure are a transparent display panel and a display device, used for prolonging the service life of an electroluminescent device in the transparent display panel. According to the transparent display panel provided by the embodiment of the present disclosure, the transparent display panel is divided into a display area arranged in an array and a light-transmitting area surrounding the display area; the display area comprises a transparent substrate, an electroluminescent device positioned on the transparent substrate, and a light blocking part located on the side of the transparent substrate deviating from the electroluminescent device; the light blocking part is used for
(Continued)

blocking light entering from the side of the transparent substrate deviating from the electroluminescent device to irradiate the electroluminescent device.

10 Claims, 4 Drawing Sheets

(52) U.S. Cl.
CPC ............ *G02F 1/0126* (2013.01); *G02F 1/155* (2013.01); *G02F 1/157* (2013.01); *H10K 59/12* (2023.02); *B60R 2011/0026* (2013.01)

(56) References Cited

U.S. PATENT DOCUMENTS

2017/0369771 A1* 12/2017 Kim .................. G02F 1/157
2018/0149908 A1   5/2018 Park et al.

FOREIGN PATENT DOCUMENTS

| | | |
|---|---|---|
| CN | 107644895 A | 1/2018 |
| CN | 108121100 A | 6/2018 |
| CN | 109585521 A | 4/2019 |
| CN | 110224080 A | 9/2019 |
| EP | 3026708 B1 | 11/2017 |
| KR | 20160098654 A | 8/2016 |

OTHER PUBLICATIONS

Ying et al., The Organic Light Emitting Display Panel, Its preparation method, Driving Method and Display Device, CN 107644895A, Jan. 30, 2018. (Year: 2018).*
CN201910528692.X First Office Action.
CN201910528692.X Second Office Action, dated Oct. 25, 2023.
CN201910528692.X Third Office Action.

* cited by examiner

TRANSPARENT DISPLAY PANEL AND DISPLAY DEVICE

CROSS REFERENCE TO RELATED APPLICATIONS

The present application is a National Stage of International Application No. PCT/CN2020/089495, filed on May 9, 2020, which claims priority to the Chinese Patent Application with an application number of 201910528692.X, filed to the Patent Office of the People's Republic of China on Jun. 18, 2019 and entitled "TRANSPARENT DISPLAY PANEL AS WELL AS MANUFACTURING METHOD THEREOF AND DISPLAY DEVICE", the entire contents of which are incorporated herein by reference.

FIELD

The present disclosure relates to the technical field of display, and in particular to a transparent display panel and a display device.

BACKGROUND

An organic light emitting diode (OLED) has become the most potential new display device in recent years due to its auto-luminescence, fast response, ultra-light and ultra-thin properties, a high contrast ratio and the like. When a transparent OLED display device is applied to a vehicle-mounted sunroof, the vehicle-mounted sunroof can have a display function to display images and some external environmental indexes, and also has a certain degree of transparency to ensure that a certain amount of light enters a vehicle, so that passengers can see the outside environment at any time. The combination of a transparent display device and the vehicle-mounted sunroof makes an obtained product more interesting and also brings a wonderful visual impact to passengers.

SUMMARY

In a first aspect, the transparent display panel provided by an embodiment of the present disclosure includes a display area and a light-transmitting area;
the display area includes a transparent substrate, an electroluminescent device positioned on one side of the transparent substrate, and a light blocking part on a side of away from the electroluminescent device, of the transparent substrate; and
the light blocking part is configured to block light entering from the side away from the electroluminescent device, of the transparent substrate to irradiate the electroluminescent device.

Optionally, in the transparent display panel provided by an embodiment of the present disclosure, the light blocking part includes a metal layer or a polymer film doped with an ultraviolet absorber.

Optionally, in the transparent display panel provided by an embodiment of the present disclosure, the light blocking part includes: a first electrode and a second electrode arranged in a stacked manner, and a first electrochromic layer located between the first electrode and the second electrode.

Optionally, in the transparent display panel provided by an embodiment of the present disclosure, the light-transmitting area includes a transmission part located on a side away from the electroluminescent device, of the transparent substrate.

Optionally, in the transparent display panel provided by an embodiment of the present disclosure, the light transmittance of the transmission part is adjustable.

Optionally, in the transparent display panel provided by an embodiment of the present disclosure, the transmission part includes a photochromic film layer.

Optionally, in the transparent display panel provided by an embodiment of the present disclosure, the transmission part includes: a third electrode and a fourth electrode arranged in a stacked manner, and a second electrochromic layer located between the third electrode and the fourth electrode.

Optionally, in the transparent display panel provided by an embodiment of the present disclosure, the light blocking part includes: a first electrode and a second electrode arranged in a stacked manner, and a first electrochromic layer located between the first electrode and the second electrode;
wherein, the first electrode and the third electrode are arranged at a same layer and made of a same material; and
the second electrode and the fourth electrode are arranged at a same layer and made of a same material.

Optionally, in the transparent display panel provided by an embodiment of the present disclosure, the transparent display panel further includes a protective layer located on the side away from the transparent substrate, of the light blocking part.

In a second aspect, the display device provided by an embodiment of the present disclosure includes any one of the transparent display panels provided by some embodiments of the present disclosure.

BRIEF DESCRIPTION OF THE DRAWINGS

In order to describe the technical solutions in the embodiment of the present disclosure more clearly, the accompanying drawings required in the description of the embodiment will be briefly described below. Apparently, the accompanying drawings described below are merely accompanying drawings of some embodiments of the present disclosure, and other accompanying drawings may also be obtained based on these accompanying drawings by those of ordinary skill in the art without any creative work.

DETAILED DESCRIPTION

Figure 1:
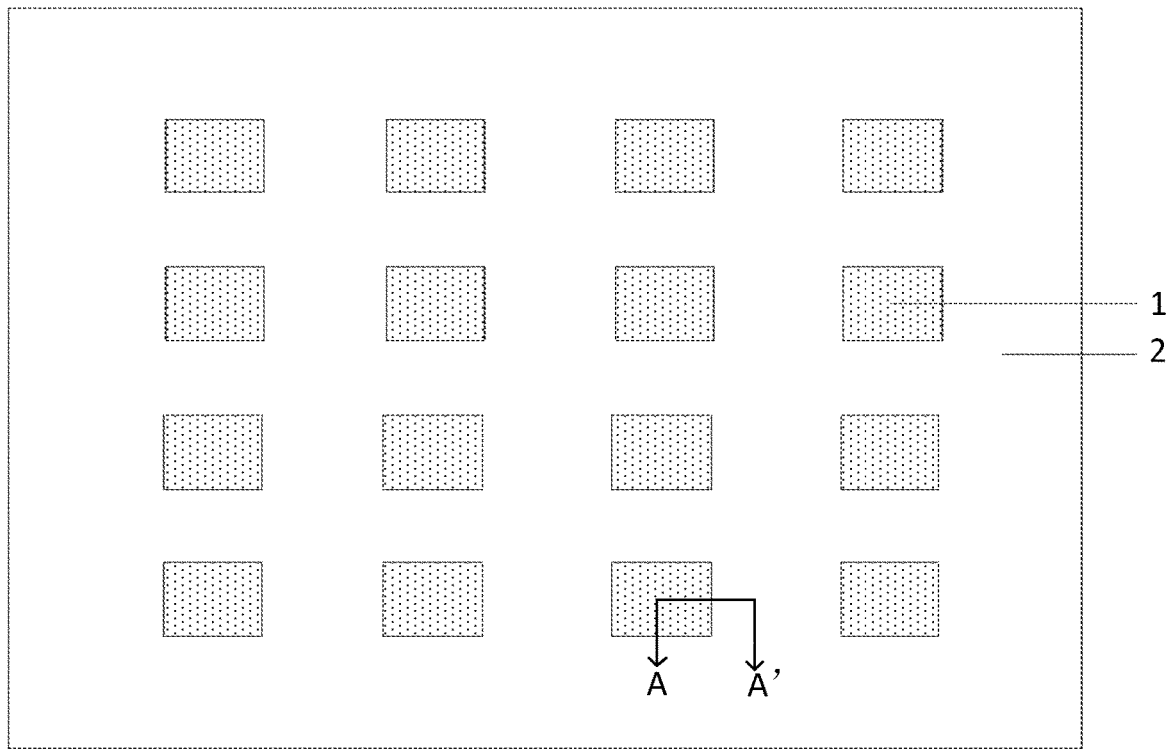
FIG. 1 is a schematic diagram of a transparent display panel provided by an embodiment of the present disclosure.

In order to make the above objectives, features and advantages of the present disclosure clearer and more understandable, the present disclosure will be further described below with reference to the accompanying drawings and embodiments. However, exemplary embodiments can be implemented in a variety of forms, and should not be construed as being limited to the embodiments described herein; on the contrary, these embodiments are provided to make the present disclosure more comprehensive and complete, and the concepts of the exemplary embodiments are comprehensively conveyed to those skilled in the art. The same reference numerals in the figures represent the same or similar structures, and therefore repeated description about them will be omitted. The words representing positions and directions described in the present disclosure are all illustrated by taking the accompanying drawings as examples, but changes may also be made as required, and all these changes shall be included in the protection scope of the present disclosure. The accompanying drawings of the present disclosure are merely used to illustrate relative position relationships rather than to represent true proportions.

It should be noted that specific details are described in the following description in order to fully understand the present disclosure. However, the present disclosure can be implemented in a variety of other ways different from those described herein, and those skilled in the art may make similar promotion without departing from the nature of the present disclosure. Therefore, the present disclosure is not limited by the specific embodiments disclosed below. The follow-up description of the description is a preferred embodiment for implementing the present disclosure, but it is intended to explain the general principles of the present disclosure rather than limit the scope of the present disclosure. The protection scope of the present disclosure shall be subject to those defined by the appended claims.

The transparent display panel and the display device provided some the embodiment of the present disclosure will be described in detail below with reference to the accompanying drawings.

Figure 2:
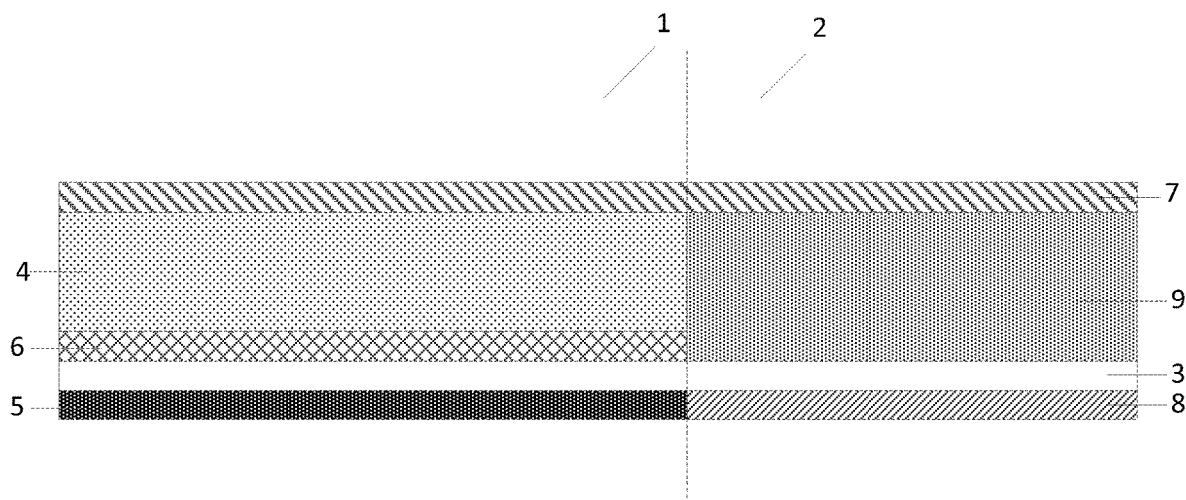
FIG. 2 is a schematic diagram of a section along AA' in FIG. 1 provided by an embodiment of the present disclosure.

An embodiment of the present disclosure provides a transparent display panel. As shown in FIG. 1, the transparent display panel includes a display area 1 and a light-transmitting area 2. A section along AA' in FIG. 1 is as shown in FIG. 2. The display area 1 includes: a transparent substrate 3, an electroluminescent device 4 positioned on the side of the transparent substrate 3, and a light blocking part 5 located on the side of the transparent substrate 3 deviating from the electroluminescent device 4, wherein the light blocking part 5 is configured to block light entering from the side of the transparent substrate 3 deviating from the electroluminescent device 4 to irradiate the electroluminescent device 4.

According to the transparent display panel provided by an embodiment of the present disclosure, since the display area includes the light blocking part, the light blocking part may block the light entering from the side of the transparent substrate deviating from the electroluminescent device to irradiate the electroluminescent device, a damage of the electroluminescent device caused by irradiation of ambient light can be reduced, the service life of the electroluminescent device can be prolonged, and the service life of the transparent display panel can be prolonged.

According to the transparent display panel provided by an embodiment of the present disclosure, the display area includes the electroluminescent device, in other words, the transparent display panel provided by the embodiment of the present disclosure is an electroluminescent display panel. In the electroluminescent display panel, the electroluminescent device may be, for example, an electroluminescent diode, and the electroluminescent diode may be, for example, an organic light emitting diode (OLED), in other words, the transparent display panel provided by the embodiment of the present disclosure may be an OLED transparent display panel.

The transparent display panel provided by an embodiment of the present disclosure may be applied to a vehicle-mounted sunroof. Since the display area is provided with the light blocking part, the electroluminescent device may be prevented from being irradiated by ultraviolet light, thus a damage of the electroluminescent device caused by environmental ultraviolet light can be reduced, and the service life of the electroluminescent device is prolonged; light entering a vehicle can also be reduced to guarantee a comfort temperature in the vehicle; and meanwhile, light can transmit through the light-transmitting area so that a user in the vehicle may watch the outside environment while watching displayed images.

Optionally, as shown in FIG. 2, the transparent display panel provided by an embodiment of the present disclosure further includes: a pixel circuit 6 located between the transparent substrate 3 and the electroluminescent device 4, and an encapsulation layer 7 located on the electroluminescent device 4, wherein the light-transmitting area further includes a transparent filling part 9.

According to the transparent display panel provided by an embodiment of the present disclosure, the transparent substrate may be a transparent glass substrate, a quartz substrate or an organic polymer substrate, etc., which is not limited herein.

According to the transparent display panel provided by an embodiment of the present disclosure, the pixel circuit includes, for example, a plurality of transistors, and the electroluminescent device may be driven to emit light through interaction of these transistors so as to realize a display function. Each transistor may be, for example, a thin film transistor (TFT) including film layers of an active layer, a gate, a gate insulating layer, a source, a drain, a passivation layer, a planarization layer, etc., wherein the thin film transistor may be a low-temperature polysilicon thin film transistor.

According to the transparent display panel provided by an embodiment of the present disclosure, the transparent filling part may be, for example, transparent polyimide (PI) glue, which is not limited herein.

According to the transparent display panel provided by an embodiment of the present disclosure, the encapsulation layer is a transparent encapsulation layer used to, together with the transparent substrate, encapsulate the pixel circuit and the electroluminescent device in a confined space. In this way, water vapor and oxygen in the environment are prevented from entering the confined space, thus materials of the pixel circuit and the electroluminescent device are protected from corrosion, and the service life of the transparent display panel is prolonged.

The encapsulation layer may be an encapsulation substrate; for example, a transparent glass substrate, a quartz substrate, etc. may be used for encapsulation. Of course, a thin film encapsulation technology may be used for encapsulation; for example, a thin film formed by an organic polymer or a metal oxide may be used for encapsulation, which is not limited herein.

Figure 3:
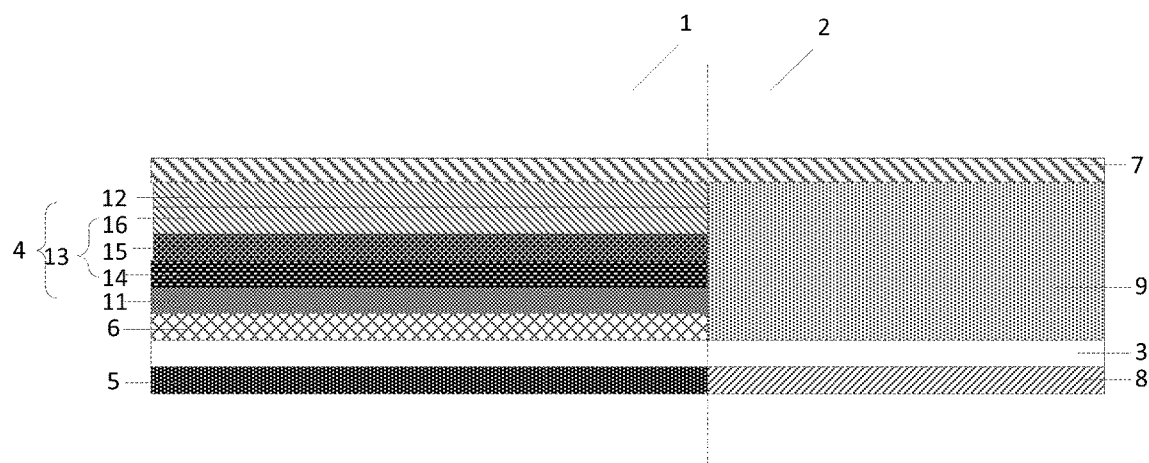
FIG. 3 is a schematic diagram of another transparent display panel provided by an embodiment of the present disclosure.

As shown in FIG. 3, the electroluminescent device 4 may include an anode 11, a cathode 12 and a light-emitting function layer 13 which is located between the anode 11 and the cathode 12. The light-emitting function layer 13 includes a hole transmitting layer or a hole filling layer 14, a light-emitting layer 15 and an electron transmitting layer or an electron filling layer 16. Of course, except the light-emitting layer, the light-emitting function layer may include one or more of a hole filling layer, a hole transmitting layer, an electron blocking layer, a hole blocking layer, an electron transmitting layer, and an electron filling layer. The light-emitting layer may include, for example, a red light emitting material, a blue light emitting material, and a green light emitting material.

Optionally, in the transparent display panel provided by an embodiment of the present disclosure, the light blocking part includes a metal layer or a polymer film doped with an ultraviolet absorber, which is not limited herein.

When the light blocking part is the metal layer, the metal layer may prevent light from irradiating the electroluminescent device, thereby reducing a damage of the electroluminescent device caused by irradiation of ambient light and prolonging the service life of the electroluminescent device.

The metal layer may be made of a metal material with a high reflectivity, such as aluminum (Al), which is not limited herein.

When the light blocking part is the polymer film doped with the ultraviolet absorber, it absorbs ultraviolet light to avoid a damage caused by ultraviolet light irradiating the electroluminescent device, and therefore the service life of the electroluminescent device is prolonged.

A polymer doped with an ultraviolet absorber may be, for example, an acrylic polymer, which is not limited herein.

Optionally, by taking the acrylic polymer as an example, a method for preparing the polymer doped with the ultraviolet absorber will be exemplified below.

First, an acrylic prepolymer is prepared: first a plurality of acrylic monomers are used to synthesize a resin, and then the synthesized resin and other monomers including an active monomer of an ultraviolet absorber are polymerized to form a polymer.

Afterwards, a photoinitiator is used to absorb energy of a certain wavelength in an ultraviolet light or visible light area to initiate polymerization, crosslinking and curing of the monomers to form the polymer doped with the ultraviolet absorber.

The active monomer of the doped ultraviolet absorber may be lauryl acrylate, hydroxyethyl acrylate, stearyl acrylate, hydroxypropyl acrylate, etc. A wavelength range of the ultraviolet light area is 250 nm to 420 nm, and a wavelength range of the visible light area is 400 nm to 800 nm. The polymer film doped with the ultraviolet absorber may be a single layer or a multilayer.

Figure 4:
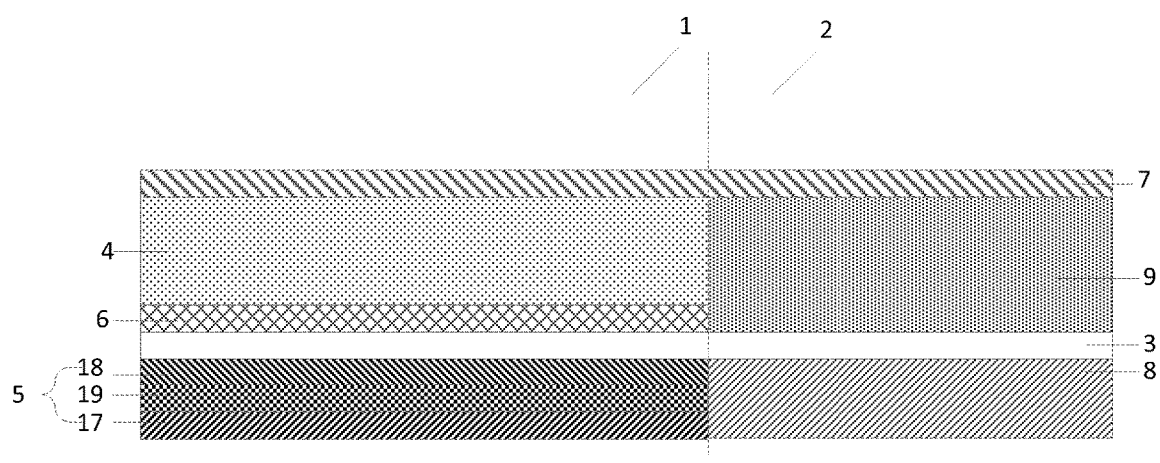
FIG. 4 is a schematic diagram of another transparent display panel provided by an embodiment of the present disclosure.

Optionally, in the transparent display panel provided by an embodiment of the present disclosure, as shown in FIG. 4, the light blocking part 5 includes: a first electrode 17 and a second electrode 18 arranged in a stacked manner, as well as a first electrochromic layer 19 located between the first electrode 17 and the second electrode 18.

According to the transparent display panel provided by an embodiment of the present disclosure, voltage signals loaded between the first electrode and the second electrode may be different according to the actual needs, to control the first electrochromic layer change in color, so as to change the light transmittance of the first electrochromic layer. By taking a transparent display panel applied to a vehicle-mounted sunroof as an example, when external ambient light is at a low intensity and the transparent display panel is in a non-display state, a first voltage may be applied between the first electrode and the second electrode to make the first electrochromic layer in a color allowing external light to be transmitted, thus a light transmission function is achieved and the comfort of a user is improved; when the external ambient light is at a high intensity or a low intensity and the transparent display panel needs to perform display, a second voltage is applied between the first electrode and the second electrode to make the first electrochromic layer in a color capable of preventing external light from entering a vehicle, thus sunlight is prevented from irradiating the electroluminescent device, a damage of the electroluminescent device caused by ambient light is reduced, and the service life of the electroluminescent device is prolonged.

Optionally, in the transparent display panel provided by an embodiment of the present disclosure, the light-transmitting area includes a transmission part located on the side away from the electroluminescent device, of the transparent substrate.

In the transparent display panel as shown in FIG. 2 to FIG. 4 provided by an embodiment of the present disclosure, the light-transmitting area 2 includes a transmission part 8.

Optionally, the transmission part is a transparent film layer with a fixed light transmittance. Thus, light may be ensured to pass through the light-transmitting area.

Optionally, the transparent film layer may be made of a material with a high transmittance. In order to lower the reflectance of light as much as possible, the transparent film layer may be made of a material with a refractive index close to that of an adjacent film layer. According to the transparent display panel provided by an embodiment of the present disclosure, the transparent film layer is adjacent to the transparent substrate, in other words, the refractive index of the transparent film layer may be close to or even equal to that of the transparent substrate.

Optionally, in the transparent display panel provided by an embodiment of the present disclosure, the light transmittance of the transmission part may be adjustable.

According to the transparent display panel provided by an embodiment of the present disclosure, the light transmittance of the transmission part is adjustable, so the light transmittance of the transparent display panel may be adjusted according to the actual needs. For example, a user may adjust the proportion of incident light according to the intensity of external ambient light, and may adjust the contrast of the display panel to improve user experience. Also, by taking a transparent display panel applied to a vehicle-mounted sunroof as an example, for example, the transmission part has a first light transmittance and a second light transmittance, the first light transmittance is greater than the second light transmittance, when the intensity of external light is relatively low, the light transmittance of the transmission part is considered as the first light transmittance, and when the intensity of the external light is relatively high, the light transmittance of the transmission part is considered as the second light transmittance. Thus, discomfort caused by high-intensity external light can be prevented, comfort in the vehicle can be improved and user experience is improved.

Optionally, according to the transparent display panel as shown in FIG. 2 to FIG. 4 provided by an embodiment of the present disclosure, the transmission part 8 includes a photochromic film layer, which is not limited herein.

Optionally, another product may be obtained through a specific chemical reaction after a photochromic material is irradiated by light with a certain wavelength and intensity. The absorption spectrum of the obtained product is different from that of an unirradiated photochromic material, and thus, the photochromic material changes in color after irradiated by the light with this wavelength and intensity. The color-changed material can be restored to the structure before the color is changed under irradiation of light with another wavelength or the thermal action.

According to the transparent display panel provided by an embodiment of the present disclosure, for example, the photochromic film layer may have a higher light transmittance when the external ambient light is at a low intensity than when the external ambient light is at a high intensity; and optionally, a photochromic material which is in a light color under low-intensity light irradiation and is in a dark color under high-intensity light irradiation may be selected.

Of course, in the transparent display panel provided by an embodiment of the present disclosure, the transmission part with a adjustable light transmittance may also be configured in other ways, which is not limited herein.

Figure 5:
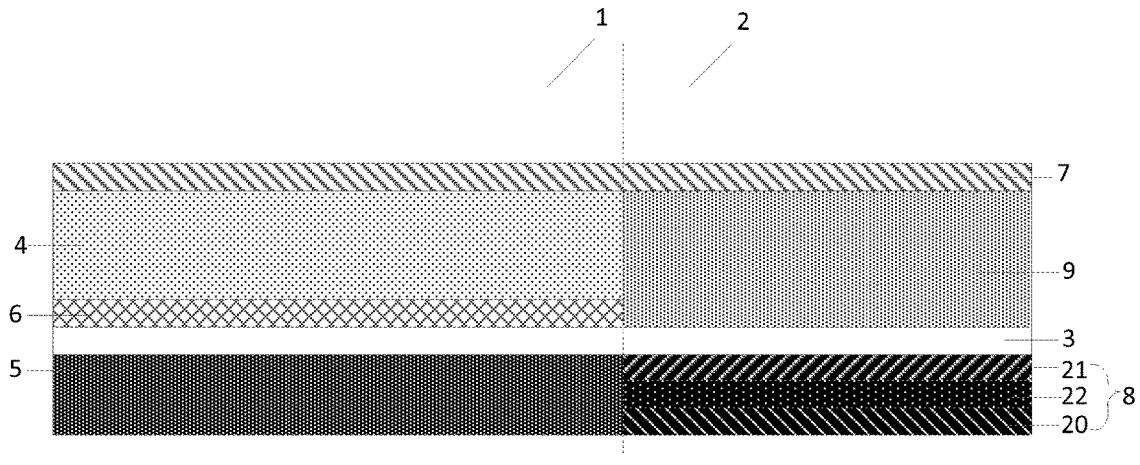
FIG. 5 is a schematic diagram of another transparent display panel provided by an embodiment of the present disclosure.
Figure 6:
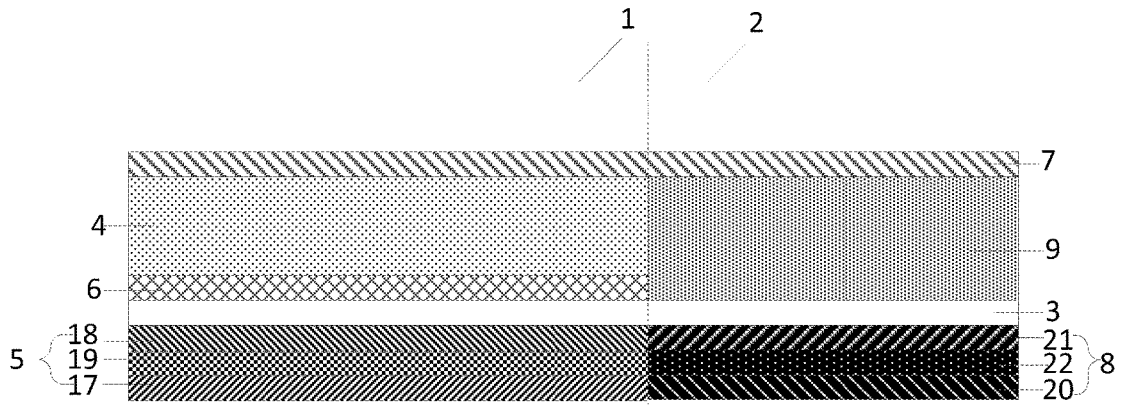
FIG. 6 is a structural schematic diagram of another transparent display panel provided by an embodiment of the present disclosure.
Figure 7:
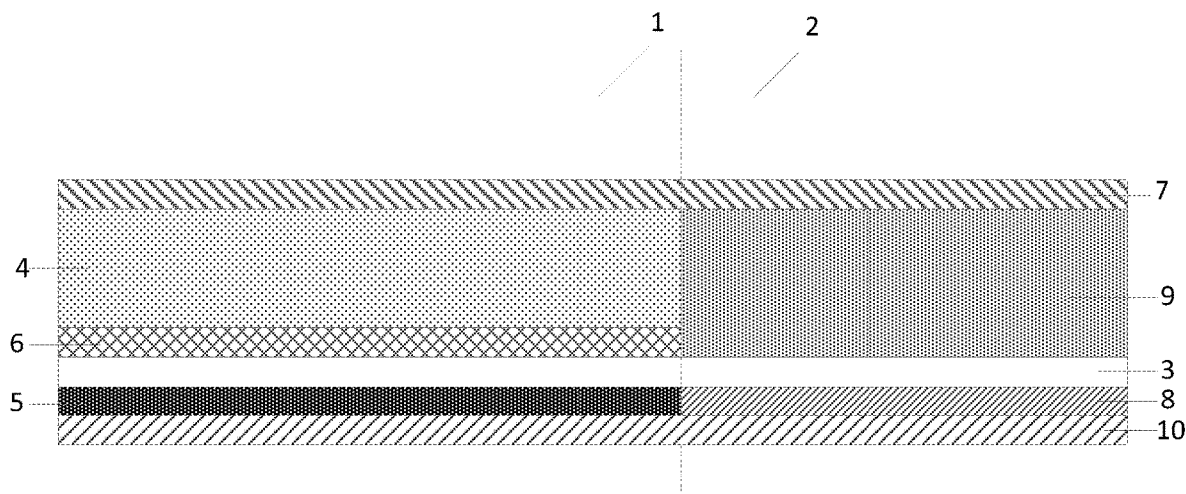
FIG. 7 is a structural schematic diagram of another transparent display panel provided by an embodiment of the present disclosure.
Figure 8:
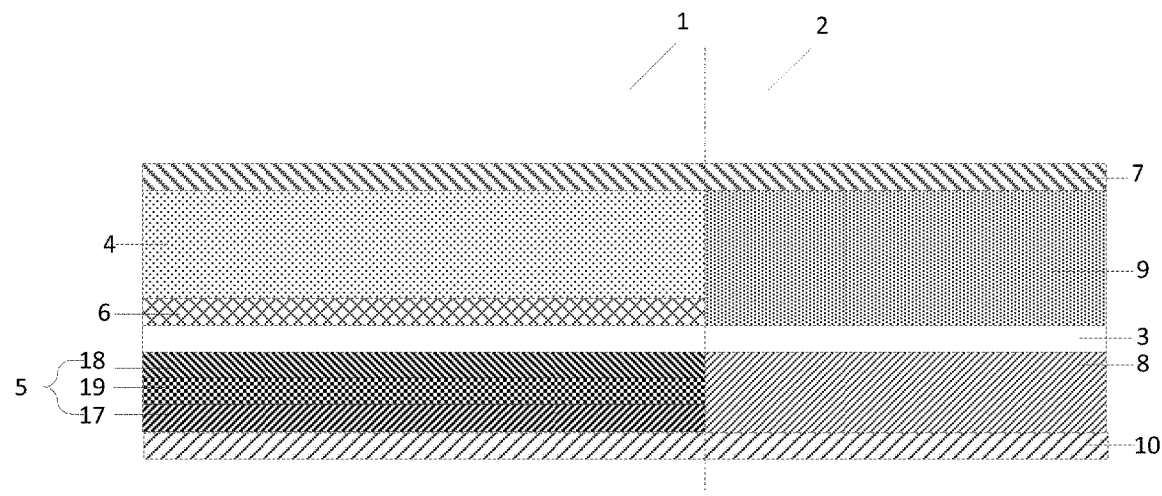
FIG. 8 is a structural schematic diagram of another transparent display panel provided by an embodiment of the present disclosure.
Figure 9:
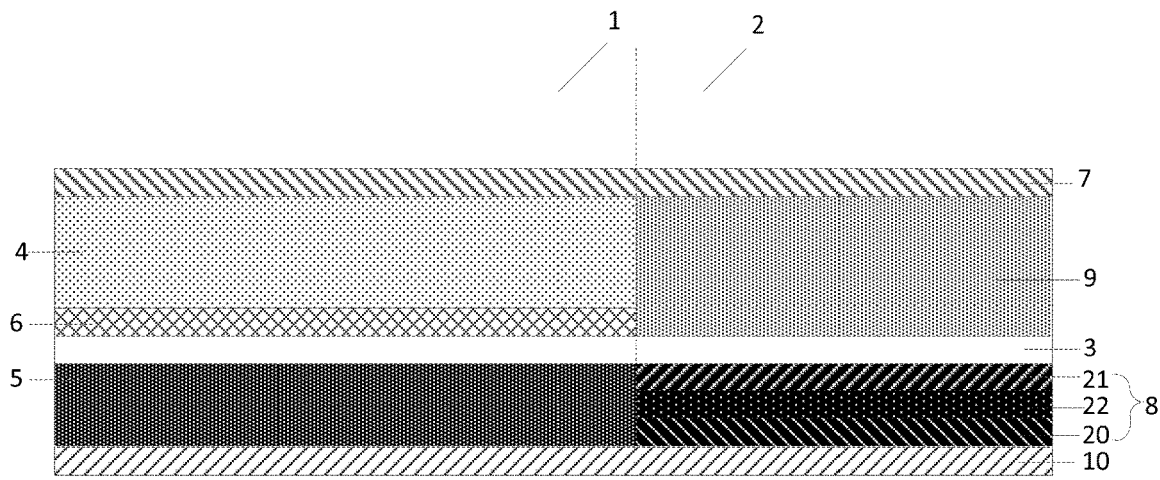
FIG. 9 is a structural schematic diagram of another transparent display panel provided by an embodiment of the present disclosure.
Figure 10:
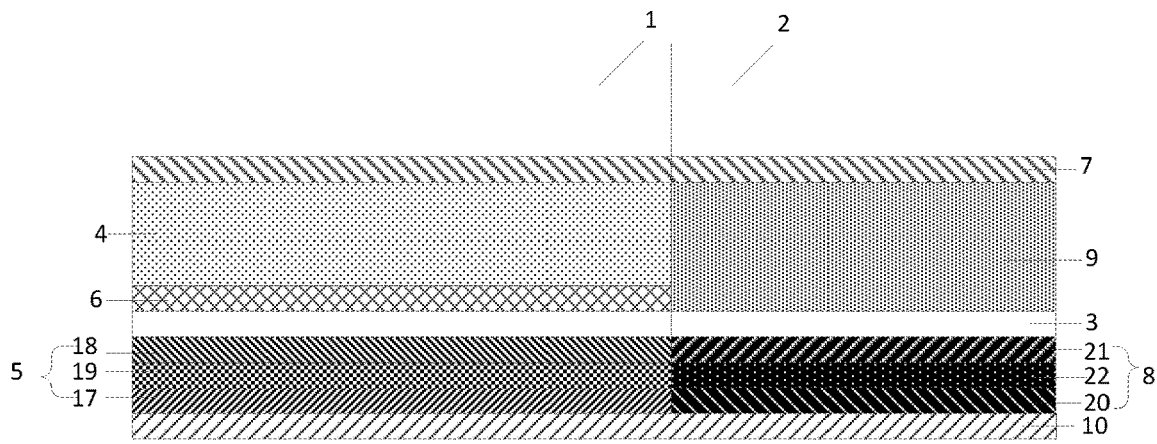
FIG. 10 is a structural schematic diagram of another transparent display panel provided by an embodiment of the present disclosure.

Optionally, in the transparent display panel provided by an embodiment of the present disclosure, as shown in FIG. 5 and FIG. 6, the transmission part 8 includes: a third electrode 20 and a fourth electrode 21 arranged in a stacked manner, as well as a second electrochromic layer 22 located between the third electrode 20 and the fourth electrode 21.

According to the transparent display panel provided by an embodiment of the present disclosure, voltage signals are loaded through the third electrode and the fourth electrode; for example, different voltages are loaded between the third electrode and the fourth electrode according to actual needs, to control the second electrochromic layer change in color so as to change the light transmittance of the second electrochromic layer.

By still taking a transparent display panel applied to a vehicle-mounted skylight as an example, when external ambient light is at a low intensity, a third voltage is applied between the third electrode and the fourth electrode to make the light transmittance of the transmission part be a first light transmittance; when the external ambient light is at a high intensity, a fourth voltage is applied between the third electrode and the fourth electrode to make the light transmittance of the transmission part be a second light transmittance, thereby preventing discomfort caused by incidence of high-intensity external light, and improving the comfort in a vehicle. As the light transmittance of the second electrochromic layer changes, the contrast of the display panel changes as well.

According to the transparent display panel as shown in FIG. 5 provided by an embodiment of the present disclosure, the light blocking part may be, for example, a metal layer or a polymer film doped with an ultraviolet absorber.

According to the transparent display panel as shown in FIG. 6 provided by an embodiment of the present disclosure, the display area and the light-transmitting area are each provided with an electrochromic layer, in other words, the light transmittances of both the display area and the light-transmitting area can be changed.

Optionally, in the transparent display panel provided by an embodiment of the present disclosure, the first electrode and the third electrode are arranged at the same layer and made of the same material; and the second electrode and the fourth electrode are arranged at the same layer and made of the same material.

Optionally, the third electrode and the first electrode may be integrally formed; the fourth electrode and the second electrode may be integrally formed; namely the upper and lower electrodes of the electrochromic layer may be arranged on an overall surface, so that the light transmittances of the display area and the light-transmitting area may be controlled simultaneously; and no matter the external ambient light is at an any intensity, the first electrochromic layer and the second electrochromic layer are loaded with the same voltage signal.

Of course, the light transmittances of the display area and the light-transmitting area may be controlled separately, namely the first electrode and the third electrode located at the same layer may be arranged separately, and the second electrode and the fourth electrode located at the same layer may be arranged separately. When the transparent display panel is under a condition that the ambient light is at any light intensity, the first electrochromic layer and the second electrochromic layer may be loaded with the same voltage signal or different voltage signals. A third voltage signal may be the same as a first voltage signal, and a fourth voltage signal may be the same as a second voltage signal. For example, when the external ambient light is at a low intensity and the transparent display panel is in a non-display state, the first voltage signal may be applied to the first electrochromic layer and the second electrochromic layer, so that the first electrochromic layer is in a color allowing external light to be transmitted, thus a light transmission function may be realized to improve the comfort of a user. When the external ambient light is at a low intensity and the transparent display panel is in a display state, the second voltage signal may be applied to the first electrochromic layer, so that the first electrochromic layer is in a color preventing external light from entering the vehicle, thereby preventing sunlight from irradiating an OLED device unit, reducing a damage of the OLED device caused by the ambient light and prolonging the service life of the OLED device. Simultaneously, the first voltage signal or the second voltage signal is applied to the second electrochromic layer to realize transparent display or increase the display contrast. When the external ambient light is at a high intensity and the transparent display panel is in a display state, the second voltage signal may be applied to the first electrochromic layer, so that the first electrochromic layer is in a color preventing external light from entering the vehicle, thereby preventing sunlight from irradiating an OLED device unit, reducing a damage of the OLED device caused by the ambient light and prolonging the service life of the OLED device. Simultaneously, the first voltage signal or the second voltage signal is applied to the second electrochromic layer to realize transparent display or increase the display contrast.

The first electrode, the second electrode, the third electrode, and the fourth electrode may be transparent electrodes.

Optionally, as shown in FIG. 7, FIG. 8, FIG. 9 and FIG. 10, the transparent display panel provided by an embodiment of the present disclosure further includes: a protective layer 10 located on the side away from the transparent substrate 3, of the light blocking part 5.

The protective layer 10 may be arranged on the side away from the transparent substrate 3, of the light blocking part 5 to prevent water, oxygen and external environment from damaging the light blocking part 5 and the transmission part 8.

Optionally, the protective layer may be an inorganic protective layer. The inorganic material may be, for example, silicon oxide or silicon nitride, which is not limited herein.

Figure 11:
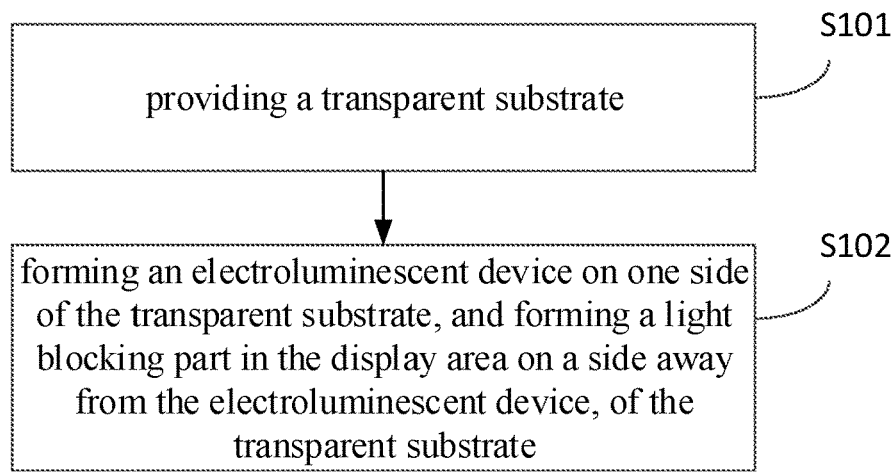
FIG. 11 is a schematic flowchart of a method for manufacturing a transparent display panel provided by an embodiment of the present disclosure.

An embodiment of the present disclosure provides a method for manufacturing the above-mentioned transparent display panel, as shown in FIG. 11, including:

S101, providing a transparent substrate; and

S102, forming an electroluminescent device in a display area on one side of the transparent substrate, and forming a light blocking part in the display area on the side away from the electroluminescent device, of the transparent substrate.

Optionally, the step S102 of forming the electroluminescent device in the display area on one side of the transparent substrate and forming the light blocking part in the display area on the side away from the electroluminescent device, of the transparent substrate includes:

forming the light blocking part and a transmission part on one side of the transparent substrate; and sequentially forming a pixel circuit and the electroluminescent device on the other side of the transparent substrate.

Forming the light blocking part may be, for example, forming a pattern of a metal layer or a polymer film doped with an ultraviolet absorber, or forming a pattern of a first electrode, a first electrochromic layer and a second electrode which are stacked. Forming the transmission part may be, for example, forming a pattern of a photochromic layer, or forming a pattern of a third electrode, a second electrochromic layer and a fourth electrode which are stacked.

Forming the light blocking part and the transmission part on one side of the transparent substrate when both the light blocking part and the transmission part are provided with an electrochromic layer specifically includes:

forming a second electrode on the overall surface on one side of the transparent substrate;

forming patterns of a first electrochromic layer and a second electrochromic layer on the second electrode; and forming a first electrode on the overall surface on the first electrochromic layer and the second electrochromic layer.

Alternatively, forming the light blocking part and the transmission part on one side of the transparent substrate when both the light blocking part and the transmission part are provided with an electrochromic layer includes:

forming patterns of a second electrode and a fourth electrode on one side of the transparent substrate;

forming patterns of a first electrochromic layer and a second electrochromic layer; and forming patterns of a first electrode and a third electrode on the first electrochromic layer and the second electrochromic layer.

Optionally, after forming the light blocking part and the transmission part on one side of the transparent substrate, the method further includes the step:

forming protective layers on the light blocking part and the transmission part.

Optionally, after sequentially forming the pixel circuit and an electroluminescent device on the other side of the transparent substrate, the method further includes the steps:

sequentially forming the pixel circuit and the electroluminescent device on the other side of the transparent substrate and filling the light-transmitting area on the side of the transparent substrate facing the electroluminescent device with transparent PI glue; and sequentially forming the pixel circuit and the electroluminescent device on the other side of the transparent substrate and forming an encapsulation layer covering the display area and the transparent area on the electroluminescent device.

Based on the same inventive concept, an embodiment of the present disclosure further provides a display device which includes any one of the above-mentioned transparent display panels provided by some embodiments of the present disclosure. Since the principle of the display device to solve problems is similar to that of the aforementioned transparent display panel, the implementation of the display device may refer to that of the aforementioned transparent display panel, which will not be repeated.

Optionally, the display device provided by an embodiment of the present disclosure may be, for example, a vehicle-mounted skylight, which is not limited herein.

In conclusion, according to the transparent display panel and the display device provided by some embodiments of the present disclosure, since the display area of the transparent display panel includes the light blocking part capable of blocking light entering from one side of the transparent substrate deviating from the electroluminescent device to irradiate the electroluminescent device, a damage of the electroluminescent device caused by irradiation of ambient light can be reduced, the service life of the electroluminescent device is prolonged, and the service life of the transparent display panel is prolonged.

Apparently, various alterations and variations of the present disclosure can be made by those skilled in the art without departing from the spirit and scope of the present disclosure. Therefore, if these alterations and variations of the present disclosure fall within the scope of the claims of the present disclosure and their equivalent technologies, the present disclosure is also intended to include these alterations and variations.

What is claimed is:

1. A transparent display panel, comprising a display area and a light-transmitting area;

wherein, the display area comprises a transparent substrate, an electroluminescent device positioned on one side of the transparent substrate, and a light blocking part located on a side away from the electroluminescent device, of the transparent substrate; and the light blocking part is configured to block light entering from the side away from the electroluminescent device, of the transparent substrate to irradiate the electroluminescent device;

wherein the light blocking part comprises: a first electrode and a second electrode arranged in a stacked manner, and a first electrochromic layer located between the first electrode and the second electrode;

wherein the light-transmitting area comprises a transmission part located on a side of the transparent substrate away from the electroluminescent device, of the transparent substrate; the light transmittance of the transmission part is adjustable;

wherein the transmission part comprises a third electrode and a fourth electrode arranged in a stacked manner, and a second electrochromic layer located between the third electrode and the fourth electrode;

wherein the first electrode and the third electrode is arranged separately, and the second electrode and the fourth electrode is arranged separately.

2. The transparent display panel according to claim 1, wherein
the light blocking part comprises a metal layer or a polymer film doped with an ultraviolet absorber.

3. The transparent display panel according to claim 1, wherein
the transmission part comprises a photochromic film layer.

4. The transparent display panel according to claim 1, wherein
the light blocking part comprises a first electrode and a second electrode arranged in a stacked manner, and a first electrochromic layer located between the first electrode and the second electrode;
wherein, the first electrode and the third electrode are arranged at a same layer and made of a same material; and
the second electrode and the fourth electrode are arranged at a same layer and made of a same material.

5. The transparent display panel according to claim 1, wherein
the transparent display panel further comprises a protective layer located on a side away from the transparent substrate, of the light blocking part.

6. A display device, comprising a transparent display panel, wherein the transparent display panel comprises a display area and a light-transmitting area;
wherein, the display area comprises a transparent substrate, an electroluminescent device positioned on one side of the transparent substrate, and a light blocking part located on a side away from the electroluminescent device, of the transparent substrate; and
the light blocking part is configured to block light entering from the side away from the electroluminescent device, of the transparent substrate to irradiate the electroluminescent device;

wherein the light blocking part comprises: a first electrode and a second electrode arranged in a stacked manner, and a first electrochromic layer located between the first electrode and the second electrode;

wherein the light-transmitting area comprises a transmission part located on a side of the transparent substrate away from the electroluminescent device, of the transparent substrate; the light transmittance of the transmission part is adjustable;

wherein the transmission part comprises a third electrode and a fourth electrode arranged in a stacked manner, and a second electrochromic layer located between the third electrode and the fourth electrode;

wherein the first electrode and the third electrode is arranged separately, and the second electrode and the fourth electrode is arranged separately.

7. The display device according to claim 6, wherein
the light blocking part comprises a metal layer or a polymer film doped with an ultraviolet absorber.

8. The display device according to claim 6, wherein
the transmission part comprises a photochromic film layer.

9. The display device according to claim 6, wherein
the light blocking part comprises a first electrode and a second electrode arranged in a stacked manner, and a first electrochromic layer located between the first electrode and the second electrode;
wherein, the first electrode and the third electrode are arranged at a same layer and made of a same material; and
the second electrode and the fourth electrode are arranged at a same layer and made of a same material.

10. The display device according to claim 6, wherein
the transparent display panel further comprises a protective layer located on a side away from the transparent substrate, of the light blocking part.

* * * * *